United States Patent
Plonka

Patent Number: 6,166,774
Date of Patent: *Dec. 26, 2000

[54] COMBINING NTSC VISUAL AND AURAL SIGNALS WITH DTV SIGNALS

[75] Inventor: Robert J. Plonka, Quincy, Ill.

[73] Assignee: Harris Corporation, Melbourne, Fla.

[*] Notice: This patent issued on a continued prosecution application filed under 37 CFR 1.53(d), and is subject to the twenty year patent term provisions of 35 U.S.C. 154(a)(2).

[21] Appl. No.: 09/025,362

[22] Filed: Feb. 18, 1998

Related U.S. Application Data
[60] Provisional application No. 60/042,932, Apr. 4, 1997.

[51] Int. Cl.$^7$ .................................................. H04N 7/08
[52] U.S. Cl. ......................... 348/487; 348/461; 348/584; 348/608; 348/21; 348/723; 348/484; 348/473
[58] Field of Search .................................... 348/461, 385, 348/388, 389, 473, 470, 426, 423, 487, 484, 737, 723, 475, 21, 17, 608, 486, 584; H04N 7/08, 5/21, 7/04

[56] References Cited

U.S. PATENT DOCUMENTS

| | | | |
|---|---|---|---|
| 3,984,624 | 10/1976 | Waggener | 348/461 |
| 4,821,097 | 4/1989 | Robbins | 358/143 |
| 4,958,230 | 9/1990 | Jonnalagadda et al. | 358/186 |
| 5,053,860 | 10/1991 | Tsinberg | 358/12 |
| 5,063,446 | 11/1991 | Gibson | 348/486 |
| 5,291,289 | 3/1994 | Hulyalkar et al. | 348/723 |
| 5,327,245 | 7/1994 | Unetich et al. | 348/723 |
| 5,357,284 | 10/1994 | Todd | 348/486 |
| 5,448,299 | 9/1995 | Yang et al. | 348/484 |
| 5,450,392 | 9/1995 | Waltrich | 348/21 |
| 5,461,426 | 10/1995 | Limberg et al. | 348/475 |
| 5,467,132 | 11/1995 | Fazel et al. | 348/390 |
| 5,497,205 | 3/1996 | Yang et al. | 348/737 |
| 5,563,664 | 10/1996 | Yang et al. | 348/475 |
| 5,617,148 | 4/1997 | Montgomery | 348/473 |
| 5,621,471 | 4/1997 | Kim et al. | 348/473 |
| 5,675,388 | 10/1997 | Cooper | 348/461 |
| 5,708,476 | 1/1998 | Myhrvold et al. | 348/473 |
| 5,739,866 | 4/1998 | Kim et al. | 348/473 |
| 5,774,193 | 6/1998 | Vaughan | 348/723 |
| 5,909,253 | 6/1999 | Jonnalagadda et al. | 348/473 |
| 5,946,047 | 8/1999 | Levan | 348/473 |
| 5,946,048 | 8/1999 | Levan | 348/473 |

OTHER PUBLICATIONS

Transmitting VHF–TV Equipment, RCA New Look, p. 122.

*Primary Examiner*—Michael Lee
*Assistant Examiner*—Jean W. Désir
*Attorney, Agent, or Firm*—Tarolli, Sundheim, Covell, Tummino &Szabo L.L.P.

[57] ABSTRACT

Apparatus and method are provided by which television signals may be transmitted from adjacent NTSC and DTV channels. The NTSC television signals for a first channel are selected from a frequency band including a plurality of channels and wherein this first channel includes NTSC aural and NTSC visual signals. A source of DTV television signals are selected for a second channel in the same frequency band and wherein the second channel is adjacent the first channel. The NTSC visual signal and the DTV signal are combined to provide an intermediate combined signal. The intermediate combined signal and the NTSC aural signal are then combined to provide a combined output signal for application to antenna means for transmitting television signals.

26 Claims, 3 Drawing Sheets

COMBINING NTSC VISUAL AND AURAL SIGNALS WITH DTV SIGNALS

RELATED APPLICATION

This application claims the benefit of U.S. Provisional Application Serial No. 60/042,932, filed Apr. 4, 1997.

BACKGROUND AND FIELD OF THE INVENTION

The present invention relates to transmitting television signals and, more particularly, the combining of digital signals (DTV) with analog signals (NTSC).

DESCRIPTION OF THE PRIOR ART

Television signals have traditionally been broadcast in an analog format known as NTSC. It is known that the Federal Communication Commission (FCC) will permit a new digital format known as DTV. It is presently understood that the digital format will be in operation by the year 1999 and for a transitional period until the year 2006 each present NTSC station will provide a simulcast of both NTSC signals and DTV signals. It is understood that the NTSC signals will terminate as early as the year 2006. In order for an NTSC station to simultaneously transmit a DTV signal and an NTSC signal, it must have a second channel during the transitionary period. Heretofore, the FCC has typically assigned NTSC channels to a given geographical area by assigning only every other channel (i.e., channels 2, 4, 6, 8, etc.) leaving the intervening unassigned channels (i.e., 1, 3, 5, etc.) as being unassigned. This separation has helped maintain non-interfering operation between NTSC channels. It is believed that the FCC may now consider assigning the unassigned NTSC channels within a geographical area to DTV channels. This may result in some difficulties in interference of signals between adjacent channels. The channels are all 6 MHz wide and unless special care is taken these signals from adjacent channels may interfere with each other resulting in poor reception at TV receivers.

SUMMARY OF THE INVENTION

In accordance with the present invention, apparatus and method are provided by which television signals may be transmitted from adjacent NTSC and DTV channels. The NTSC television signals for a first channel are selected from a frequency band including a plurality of channels and wherein this first channel includes NTSC aural and NTSC visual signals. A source of DTV television signals are selected for a second channel in the same frequency band and wherein the second channel is adjacent the first channel. The NTSC visual signal and the DTV signal are combined to provide an intermediate combined signal. The intermediate combined signal and the NTSC aural signal are then combined to provide a combined output signal for application to antenna means for transmitting television signals.

In accordance with a more limited aspect of the present invention the television signals for the DTS channel are from a frequency range which is of higher frequencies than that of the NTSC channel.

The NTSC channel may be referred to as N and the DTV channel may be referred to as N+1.

BRIEF DESCRIPTION OF THE DRAWINGS

The foregoing and other objects and advantages of the present invention will become more readily apparent from the following as taken in conjunction with the accompanying drawings wherein.

DESCRIPTION OF PREFERRED EMBODIMENT

Figure 1:
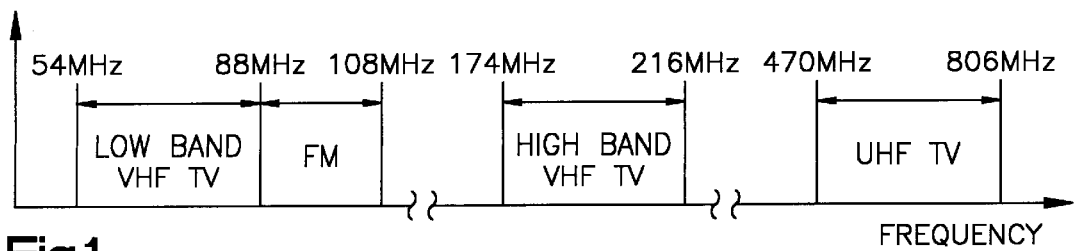
FIG. 1 is a graphical illustration of various frequency bands which may be helpful in understanding the present invention.

Reference is now made to FIG. 1 which illustrates various RF frequency bands which may be helpful in understanding the invention herein. The frequency bands depicted in FIG. 1 include a low band VHF TV frequency band, from approximately 54 MHz to 88 MHz. This is followed by an FM band from approximately 88 MHz to 108 MHz. The FM band is followed by a high band VHF TV band which extends from approximately 174 MHz to 216 MHz. The UHF TV band extends from approximately 470 MHz to 806 MHz. The VHF TV band and the UHF TV band are broken into TV channels each having a width of 6.0 MHz.

Figure 2:
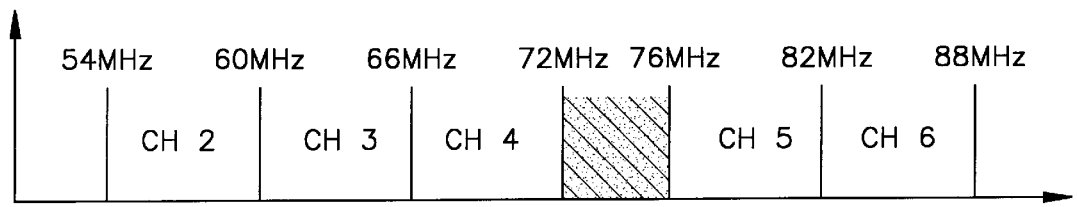
FIG. 2 is a graphical illustration of a low band VHF TV frequency band showing adjacent TV channels and which may be helpful in understanding the present invention.

Reference is now made to FIG. 2 which illustrates the division of the low band VHF TV frequency band into channels 2–6. Each TV channel is 6 MHz wide and it is seen that the FCC has assigned these channels, commencing at 54 MHz for channel 2 through 72 MHz for channel 4. Thereafter there is a blank of 4 MHz and channel 5 is assigned 76 MHz to 82 MHz which is followed by channel 6. It is to be noted that channels 4 and 5 are not adjacent due to the 4 MHz wide blank area.

The FCC has typically assigned every other channel to a NTSC station leaving the intermediate channels as being unassigned. This is true in both the VHF low and high frequency bands as well as in the UHF TV band. With the advent of high definition television there will be some pressure on the FCC to assign some DTV channels to the spaces represented by the unassigned NTSC channels in some geographical areas.

Problems may occur when adjacent channels are assigned with one channel being assigned to an NTSC station and the adjacent channel being assigned to a DTV station. The problems differ somewhat depending upon whether the DTV station is the higher numbered (higher frequency) channel or it is the lower frequency channel. There has been a tendency to refer to adjacent channel assignments wherein the higher channel is a DTV assignment as an N+1 channel assignment (N referring to the lower channel being an NTSC station and the "+1" referring to the higher channel DTV station). An N+1 channel assignment situation is illustrated in FIG. 3 and an N−1 (wherein the DTV assignment is the lower frequency) channel assignment illustrated in FIG. 4.

Figure 3:
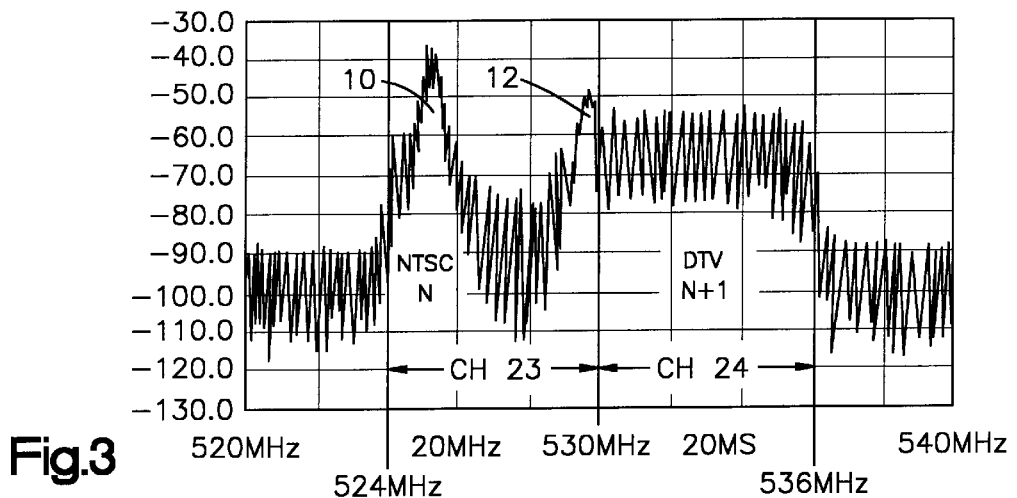
FIG. 3 is a graphical illustration of amplitude with respect to frequency showing the operation of adjacent NTSC and DTV channels with the DTV channel being of higher frequencies.

FIG. 3 illustrates the radiation pattern which takes place in an N+1 assignment wherein the lower channel is an NTSC channel and the upper channel is a DTV channel. As illustrated in FIG. 3, the lower channel is channel 23 and extends from 524 MHz to 530 MHz. The upper DTV channel is channel 24 and extends from 530 MHz to 536 MHz. The NTSC signal includes a visual portion 10 and an aural portion 12. It is known that an NTSC source will frequently provide two outputs including a visual output corresponding with visual portion 10 and an aural output corresponding with the aural portion 12. It is common in the art to combine these two sources to provide a waveform such as shown in FIG. 3 wherein the visual portion 10 and the aural portion 12 have been combined. It is to be observed from FIG. 3 that the peak of the visual portion 10 takes place at approximately 525 MHz well within the boundaries defined by channel 23. However, the aural portion 12 is at the upper end of the frequency range of channel 23 and peaks at approximately 528 MHz. Consequently, the aural portion 12 is quite close to the lower frequency end of the DTV frequency signal of channel 24. As a consequence, the assignment of these two channels adjacent to each other in an N+1 configuration presents the problem of combining an NTSC signal with the DTV signal wherein the audio portion 12 of the NTSC signal and the lower frequency end of the DTV signal may interfere with each other. This is to be compared with the N−1 operation to be described below with reference to FIG. 4.

Figure 4:
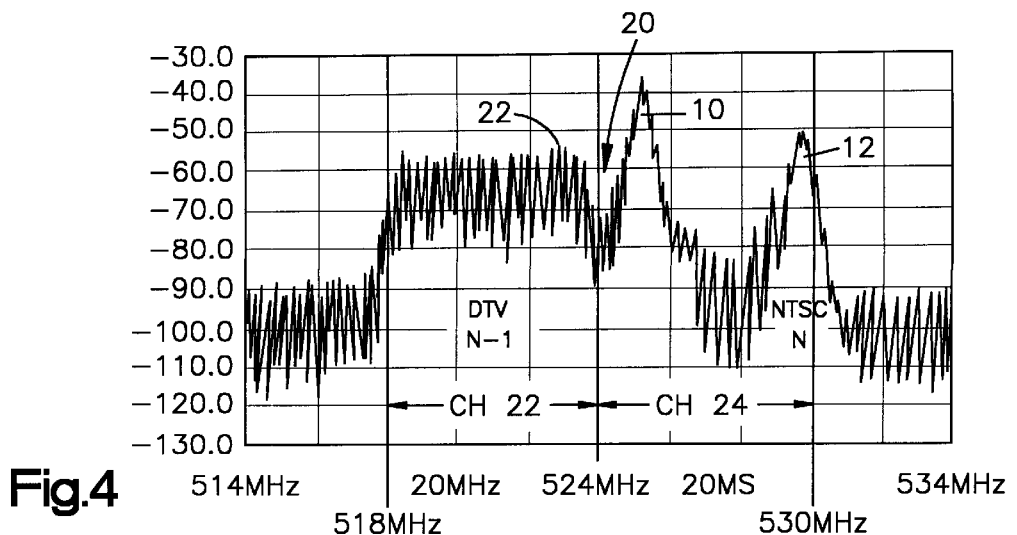
FIG. 4 is a graphical illustration similar to that of FIG. 3 but showing the NTSC channel as being of higher frequencies.

In FIG. 4 the DTV signal is assigned channel 22 which extends from 518 MHz to 524 MHz and the NTSC signal is assigned to channel 24 which extends from 524 MHz to 530 MHz. In this N−1 configuration, there is a frequency gap 20 between the right edge 22 of the DTV signal and the NTSC visual signal 10. Consequently, in an N−1 arrangement it is easier to combine a DTV signal with an NTSC signal (having both a visual portion 10 and an aural portion 12) because of the gap 20 that exists between the two frequency ranges.

In order to avoid interference presented by an N+1 arrangement, as depicted in FIG. 3, the present invention contemplates that for an N+1 arrangement (which may also be used in an N−1 arrangement) that the interference may be minimized by first combining the NTSC visual signal portion 10 (not including the aural signal portion 12) with the DTV signal to provide an intermediate combined signal which is then combined with the NTSC aural signal to provide a combined output signal for application to an antenna for transmitting television signals. The foregoing may be better understood with reference to FIGS. 5–7.

Figure 5:
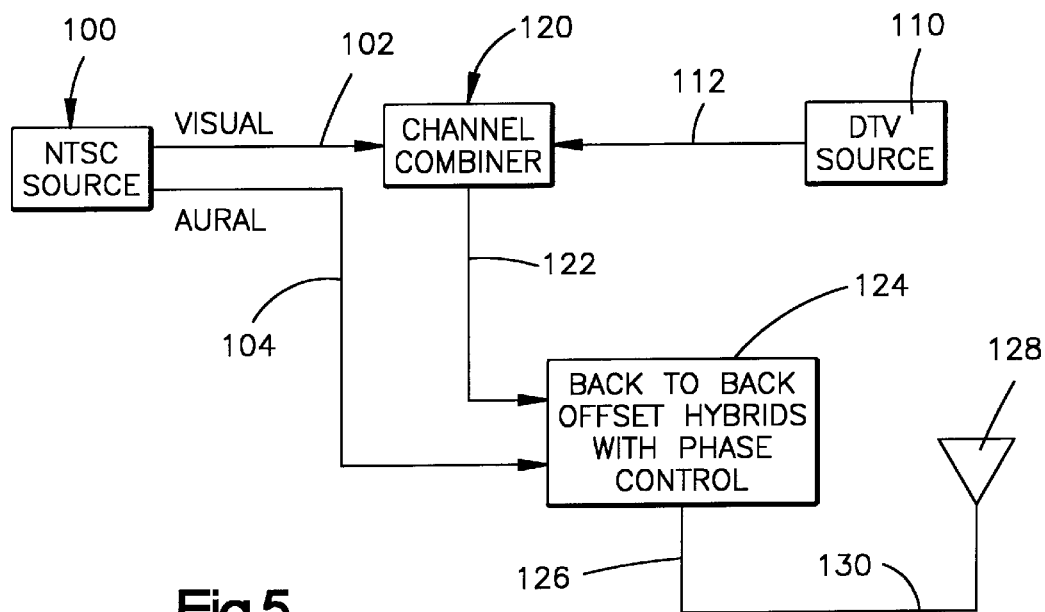
FIG. 5 is a block diagram illustrating one embodiment of present invention.

Reference is now made to FIG. 5 which illustrates one embodiment of the present invention. An NTSC signal source 100 is illustrated as providing visual signals 102 as well as aural signals 104. Also, a DTV source 110 is illustrated as providing DTV signals 112. The NTSC visual signals 102 may correspond with the NTSC visual signal portion 10 in the waveforms of FIGS. 3 and 4. Similarly, the NTSC aural signals 104 may correspond with the aural signal portion 12 in FIGS. 3 and 4. The DTV source 110 provides DTV signals such as the higher signals of channel 24 in FIG. 3 or the lower frequency signals such as channel 22 (N−1) in FIG. 4. Maximum advantage of the invention however is practiced by an N+1 assignment in which the upper frequency signals (N+1) are the DTV signals 112. Thus, in accordance with the invention, the NTSC visual signals together with the DTV signals are combined in a channel combiner 120. The output of the channel combiner 120 is an intermediate combined signal 122 which is combined with the aural signal 104 in a combiner 124. The combiner 124 provides a combined output signal 126 which is then applied to a common antenna 128 for transmitting television signals. This method of combining three signals may be referred to as "triplexing".

The combiner 124, as will be described in greater detail hereinafter with reference to FIG. 7, includes back to back offset hybrids with phase control to reduce the amount of lost aural power. The output of the combiner 124 is applied to a single feed antenna 128 by means of a single output 130. The output 130 and the antenna 128 are disclosed in greater detail in FIG. 6.

Figure 6:
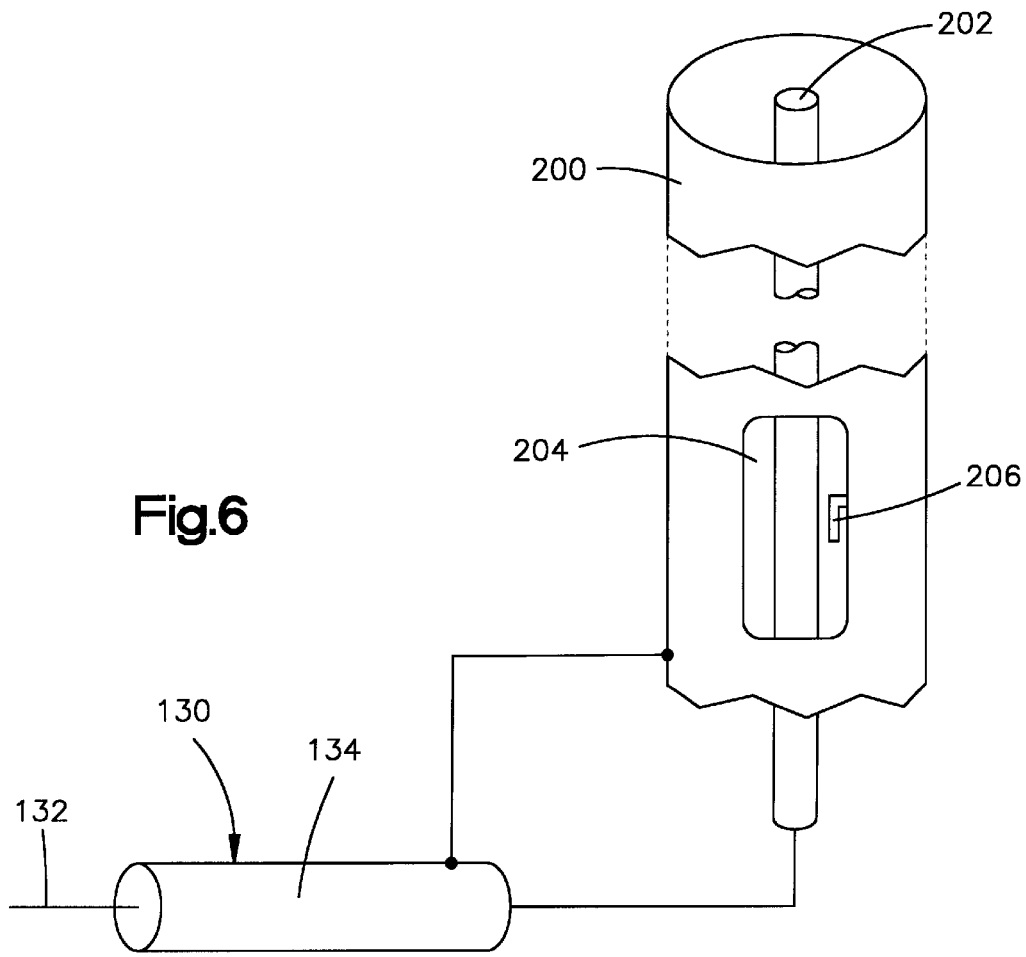
FIG. 6 is a graphical illustration showing a single input antenna of the type usable with the present invention; and, FIG. 7 is a schematic-block diagram illustration similar to that of FIG. 5 but showing greater detail.

Reference is now made to FIG. 6 which shows the output feed line conductor 130 taking the form of a coaxial cable having a center conductor 132 and an outer conductor 134. This coaxial cable is connected to a single feed input antenna such as a slot antenna, a panel antenna or the like. In the embodiment illustrated in FIG. 6 there is shown one bay of a multi-bay slot antenna. This antenna includes a cylindrical mast 200 which is cylindrical in cross section and is made of electrically conductive material, such as steel or aluminum. The mast 200 coaxially surrounds an inner conductor 202 which extends throughout the length of the mast. Conductor 202 may take the form of an elongated metal rod or pipe. Each bay (only one bay being shown in FIG. 6) includes a vertical slot 204. Each slot has associated therewith a coupling probe 206 which is suitably secured, as by welding, to one side of the slot at essentially the mid-point thereof. The probe is normally located within the interior side of the mast. Such a coupling probe assists in coupling the energy within the mast so that the radiating field appears across the slot at which a coupling probe is associated. The slot antenna is energized from the coaxial cable wherein the center conductor 132 is connected to the inner conductor 202 of the slot antenna and the outer conductor 134 of the cable is electrically connected to the mast 200.

Although only one slot 204 is shown in mast 200, it is to be understood that the antenna will have several slots which are spaced apart from each other preferably by a distance on the order of one wave length at the operating frequency. The vertical length of each slot is on the order of ½ wave length. The slots are optimized in size and slot spacing for a particular channel, such as channel 23 or 24 and so forth. As is known in the art, a change in the operating frequency requires a change in the slot length and in the spacing between the vertically oriented slots.

Figure 7:
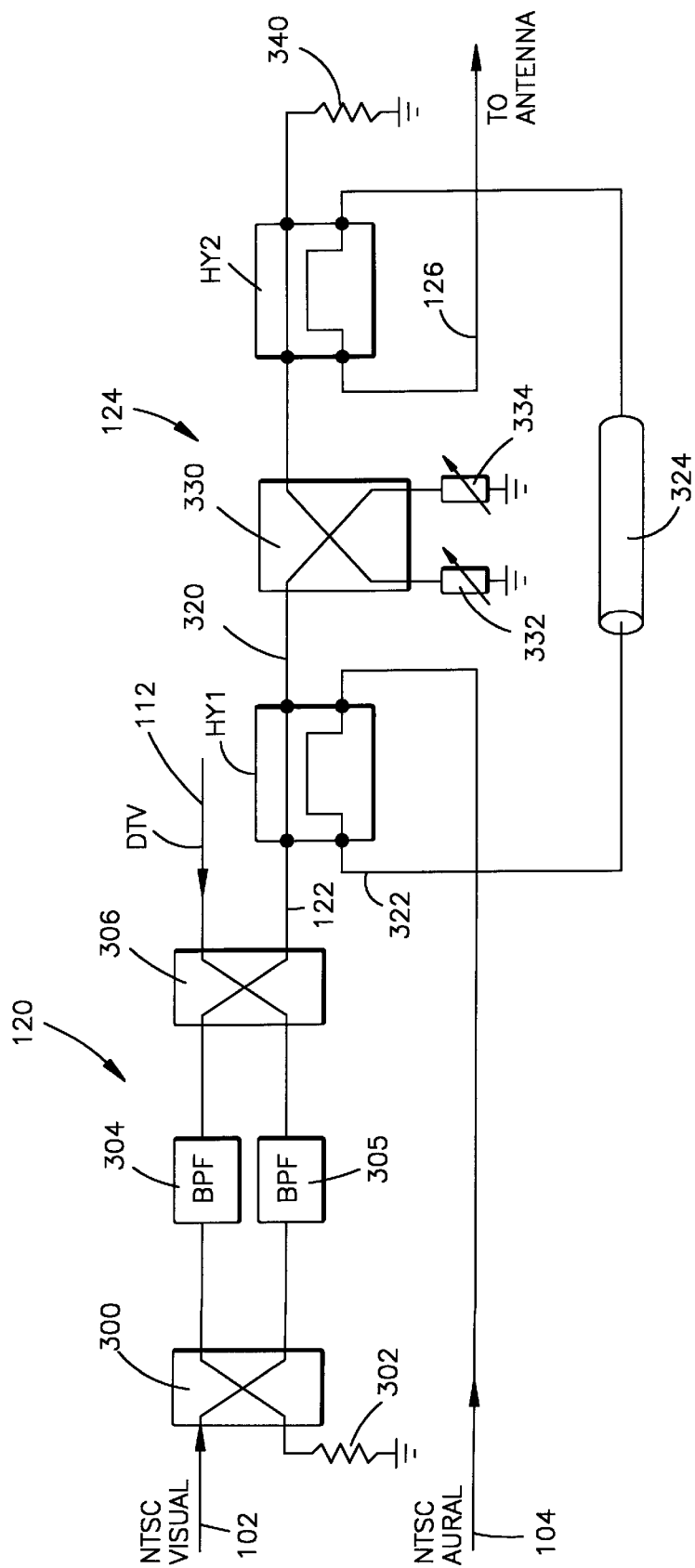

Reference is now made to FIG. 7 which illustrates the circuitry of FIG. 5 in greater detail. The channel combiner 120 of FIG. 6 is illustrated in FIG. 7 and includes an input 90° hybrid 300 having one input for receiving the NTSC visual signal 102 from the NTSC source 100 and a second input which is connected to ground by way of a resistor 302. The outputs from the hybrid 300 are applied through band pass filters 304 and 305 to a pair of inputs of a second 90° hybrid 306. The DTV signal 112 from DTV source 110 is also supplied to an input of the hybrid 306. The output from this hybrid supplies an intermediate combined signal 122 to a combiner 124 to be described below. The intermediate signal of the combiner may be considered as signal I which meets with the following equation:

$$I = V + DTV \qquad \text{Equation 1}$$

where V is equal to the visual signal 102 and DTV is equal to the DTV signal 112.

The intermediate combined signal 122 is supplied to the combiner 124 which includes back to back offset hybrids HY1 and HY2. The output of hybrid HY1 at point 320 meets with the following equation:

$$\tfrac{2}{3}V' + \tfrac{1}{3}A \qquad \text{Equation 2}$$

where V' is equal to V+DTV and A is equal to the aural signal 104.

The output at 320 of the hybrid HY1 is supplied to one input of a 90° hybrid 330. The output 322 of the hybrid circuit HY1 is supplied to a phase compensating line 324. The output of the hybrid circuit HY1 at point 322 in accordance with the following equation:

$$\tfrac{1}{3}V' + \tfrac{2}{3}A \qquad \text{Equation 3}$$

The hybrid 330 is provided with a pair of adjustable shunt cavity resonators 332 and 334 which may be used to adjust the phase of the signals to minimize aural power loss.

The output of the hybrid 330 is supplied to one input of hybrid HY2. The second input to the hybrid is obtained from the phase and time compensating line 324. Another input is connected by way of a resistor 340 to ground. The output of the hybrid HY2 is equal to the V'+A or V+DTV+A and is supplied as the output signal 126. This signal is applied by way of the coaxial cable to the single input antenna which has a two channel band width, sufficient to broadcast both the NTSC and the DTV adjacent channels.

From the above description, those skilled in the art will perceive improvements, changes and modifications. Such improvements, changes and modifications within the skill of the art are intended to be covered by the appended claims.

Having described the invention, it is now claimed:

1. Apparatus for transmitting television signals from adjacent NTSC and DTV channels comprising:
   a source of NTSC television signals for a first channel selected from a frequency band including a plurality of channels wherein said NTSC television signals include aural and visual signals;
   a source of DTV television signals from a second channel in said frequency band and wherein said second channel is adjacent to said first channel;
   first means for receiving and combining said NTSC visual signal and said DTV signal to provide an intermediate combined signal; and,
   second means for receiving and combining said intermediate combined signal with said NTSC aural signal and providing a combined output signal for application to transmitting means for transmitting television signals.

2. Apparatus as set forth in claim 1 wherein said second means includes an input hybrid coupler and an output hybrid coupler and intermediate hybrid coupler located intermediate said first and second couplers.

3. Apparatus as set forth in claim 2 wherein said intermediate hybrid coupler includes shunt cavity resonator means.

4. Apparatus as set forth in claim 3 wherein said shunt cavity resonator means includes first and second adjustable shunt resonators.

5. Apparatus as set forth in claim 2 including a phase compensator coupled between said input and output hybrid couplers.

6. Apparatus as set forth in claim 1 wherein said DTV signals are at frequencies higher than that of said NTSC signals.

7. Apparatus as set forth in claim 1 including said transmitting means having a common single input antenna having a two-channel band width for transmitting both said NTSC and said DTV signals.

8. Apparatus as set forth in claim 7 wherein said DTV signals are of frequencies higher than that of said NTSC signals.

9. Apparatus as set forth in claim 8 wherein said second means includes an input hybrid coupler and an output hybrid coupler and intermediate hybrid coupler located intermediate said first and second couplers.

10. Apparatus as set forth in claim 9 wherein said intermediate hybrid coupler includes shunt cavity resonator means.

11. Apparatus as set forth in claim 10 wherein said shunt resonator means includes first and second adjustable shunt resonators.

12. Apparatus as set forth in claim 9 including a phase compensator coupled between said input and output hybrid couplers.

13. A method of transmitting television signals from adjacent NTSC and DTV channels comprising the steps of:
   providing an NTSC channel, having NTSC visual and aural signals, said NTSC channel being selected from a frequency band including a plurality of channels;
   providing a DTV channel having a DTV signal selected from said frequency band and wherein said DTV channel is adjacent to said NTSC channel;
   combining said NTSC visual signal with said DTV signal to provide an intermediate combined signal; and,
   combining said intermediate combined signal with said NTSC aural signal to provide a combined output signal for application to transmitting means for transmitting television signals.

14. A method as set forth in claim 13 wherein said step of providing a DTV channel includes selecting a DTV signal of higher frequency than that of said NTSC visual and aural signals.

15. Apparatus for transmitting television signals from adjacent NTSC and DTV channels comprising:
   a source of NTSC television signals for a first channel selected from a frequency band including a plurality of channels wherein said NTSC television signals include aural and visual signals;
   a source of DTV television signals from a second channel in said frequency band and wherein said second channel is adjacent to said first channel;
   a first combiner that receives and combines said NTSC visual signal and said DTV signal to provide an intermediate combined signal; and,
   a second combiner that receives and combines said intermediate combined signal with said NTSC aural signal and provides a combined output signal for transmitting television signals.

16. Apparatus as set forth in claim 15 wherein said second combiner includes an input hybrid coupler and an output hybrid coupler and intermediate hybrid coupler located intermediate said first and second couplers.

17. Apparatus as set forth in claim 16 wherein said intermediate hybrid coupler includes a shunt cavity resonator.

18. Apparatus as set forth in claim 17 wherein said shunt cavity resonator includes first and second adjustable shunt resonators.

19. Apparatus as set forth in claim 16 including a phase compensator coupled between said input and output hybrid couplers.

20. Apparatus as set forth in claim 15 wherein said DTV signals are at frequencies higher than that of said NTSC signals.

21. Apparatus as set forth in claim 15 including a common single input antenna having a two-channel band width for transmitting both said NTSC and said DTV signals.

22. Apparatus as set forth in claim 21 wherein said DTV signals are of frequencies higher than that of said NTSC signals.

23. Apparatus as set forth in claim 22 wherein said second combiner includes an input hybrid coupler and an output hybrid coupler and intermediate hybrid coupler located intermediate said first and second couplers.

24. Apparatus as set forth in claim 23 wherein said intermediate hybrid coupler includes a shunt cavity resonator.

25. Apparatus as set forth in claim 24 wherein said shunt resonator includes first and second adjustable shunt resonators.

26. Apparatus as set forth in claim 23 including a phase compensator coupled between said input and output hybrid couplers.

* * * * *